United States Patent [19]

Nakaue et al.

[11] Patent Number: 5,320,877
[45] Date of Patent: Jun. 14, 1994

[54] METHOD FOR FORMING THIN FILM AND APPARATUS THEREFOR

[75] Inventors: Hirokazu Nakaue, Higashiosaka; Hideo Kurokawa, Osaka; Tsutomo Mitani, Hyogo, all of Japan

[73] Assignee: Matsushita Electric Industrial Co., Ltd., Osaka, Japan

[21] Appl. No.: 785,752

[22] Filed: Oct. 31, 1991

[30] Foreign Application Priority Data

Nov. 1, 1990 [JP] Japan .................. 2-297961
Apr. 10, 1991 [JP] Japan .................. 3-077524

[51] Int. Cl.$^5$ .................. B05D 3/06; B05D 3/12; B05C 13/00
[52] U.S. Cl. .................. 427/523; 427/561; 427/562; 427/566; 427/577; 427/242; 427/425; 118/500
[58] Field of Search .............. 427/458, 460, 457, 180, 427/184, 185, 242, 298, 177, 425, 569, 577, 530, 523, 561, 562, 566; 118/500

[56] References Cited

U.S. PATENT DOCUMENTS

| 533,303 | 1/1895 | Lee | 427/242 |
|---|---|---|---|
| 1,290,202 | 1/1919 | Horan | 118/500 |
| 3,517,644 | 6/1970 | Baer et al. | 118/49 |
| 3,583,363 | 6/1971 | Shrader | 118/500 |
| 3,608,519 | 9/1971 | Bean et al. | 118/500 |
| 3,977,926 | 8/1976 | Johnson, Jr. et al. | 427/242 |
| 4,055,683 | 10/1977 | Gusarov et al. | 427/425 |
| 4,207,356 | 6/1980 | Waugh | 427/425 |
| 4,516,523 | 5/1985 | Knox | 118/500 |
| 4,725,345 | 2/1988 | Sakamoto et al. | 427/530 |
| 4,833,031 | 5/1989 | Kurokawa et al. | 428/336 |
| 4,961,958 | 10/1990 | Desphandey et al. | 427/530 |
| 4,992,298 | 2/1991 | Deutchman et al. | 427/530 |
| 5,038,707 | 8/1991 | Swain et al. | 118/500 |
| 5,090,350 | 2/1992 | Hammond et al. | 118/500 |
| 5,112,644 | 5/1992 | Seddon et al. | 427/569 |

FOREIGN PATENT DOCUMENTS 2412620 7/1979 France .

OTHER PUBLICATIONS

"Diamond Thin Films", *C & E News*, pp. 32–33 May 15, 1989.

*Primary Examiner*—Marianne Padgett
*Attorney, Agent, or Firm*—Wenderoth, Lind & Ponack

[57] ABSTRACT

In an apparatus for forming a thin film on substrates, two substrate supporters having respective recesses therein are connected by a shaft so that the recesses oppose one another, and opposing ends of many rod-like substrates are supported on the side walls of the recesses. Then, the substrates are rotated on the side walls as the substrate supporters are revolved, and the substrates shift their positions under their own weight. In this state, deposition particles impinge against the substrates from a material source, while the rod-like substrates are stirred so that each region of the outer peripheries thereof has an equal probability of having the film deposited thereon. Thus, a uniform thin film is formed on the surface of every substrate. The numbers of recesses may be two or more. Further, a nest of substrate supporters may be used.

14 Claims, 12 Drawing Sheets

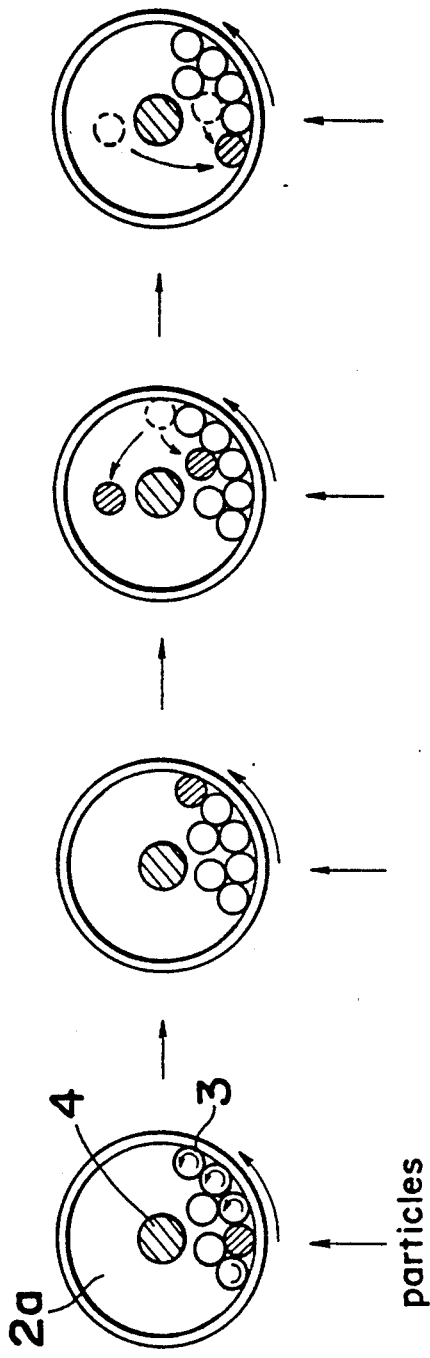

PRIOR ART

METHOD FOR FORMING THIN FILM AND APPARATUS THEREFOR

BACKGROUND OF THE INVENTION

1. Field of the Invention

The present invention relates to a method for forming a thin film, such as vacuum deposition, sputtering and chemical vapor deposition, and an apparatus therefor.

2. Prior Art

Recently, devices manufactured with thin film techniques have been researched by many workers in order to add functions and value thereto, and thin film process technology on which the characteristics of the devices depend has become an important key technology. The characteristics of thin films are affected largely by the material, shape and the like of substrates to which the thin films are applied. Therefore, individual techniques for manufacturing thin films are necessary for each usage and for each object.

When a thin film is formed on the surface of a three dimensional substrate, a film is deposited, for example, while the substrate is rotated so as to expose the surface of the substrate and allow a uniform film to be deposited. There is known a type of prior art thin film forming apparatus exemplified as an ion plating apparatus disclosed in Japanese Utility Model laid open Publication 57955/1990 and a barrel coating apparatus disclosed in Japanese Patent laid open Publication 125869/1990. In the former ion plating apparatus, many substrates are attached to a holder, and the substrates are revolved with rotation of the holder. Then, a uniform thin film is formed on each substrate. In the latter barrel coating apparatus, many substrates are enclosed in a rotating tubular barrel and evaporation material is supplied from a crucible arranged inside the barrel.

However, in such prior art apparatuses, the precision of the size of substrates to which a thin film is applied becomes deteriorated in the process of manufacturing the thin film if the substrate is a component to be used in a precision mechanism and high mechanical precision is required. Further, a problem of mass productivity may arise, depending on the form of the substrate.

For example, in an apparatus wherein a substrate such as a capstan shaft for a videocassette recorder which must be manufactured precisely has to be held in a holder, stress may arise and strain due to the stress may be generated when the temperature increases in the film-forming process. In an apparatus wherein substrates are included in a barrel, a thin film is also adhered on the barrel, and this undesirable film causes many problems. For example, if the material of the film has high electrical resistance, the quality of film becomes lower. For example, the potential of the substrate becomes unstable or discharge may cause damage to the substrate. Further, the thermal conduction from the substrate to the barrel is hindered by the film and the temperature of the substrate becomes high.

SUMMARY OF THE INVENTION

An object of the present invention is to provide a film-forming method and an apparatus for use in the method, which solve these problems.

In the present invention, two substrate supporters, each having a recess, are arranged so that the recesses oppose one another, and opposing ends of rod-like substrates are supported on side wall portion of the recesses. Then, while the substrate supporters are driven to be rotated, a thin film is uniformly formed on the substrate. The recesses preferably have a ring-shape. It is preferable that a deposition source is shaded from the side wall portion of the recess at which the rod-like substrates are supported.

Thus, the rod-like substrates do not need to be fixed to the supporters at all, but only to be put on the substrate supporters. Therefore, the operation of manufacturing the film becomes much easier. Further, because the two ends of the substrate are not fixed, but only supported on the substrate supporters, the substrate is free from thermal expansion due to heating when the thin film is deposited. Because the substrate is not subjected to thermal stress when the thin film is formed, the precision of the su' :rate is not deteriorated.

When the rod-li substrates are rotated, they continue to change th positions due to the friction with the substrate suppc :ters while the regions of the substrates which are ιxposed to the deposition material changes. Thus, each substrate has the same probability of moving into a region in which the thin film can be formed. Therefore, a uniform film is formed on the surfaces of the substrates.

By making the recesses of a cylindrical shape with a side wall portion, the substrates supported by the recesses can be maintained roughly in parallel to the rotation axis of the substrate supporters, so that a better thin film can be formed. Further, because the deposition source is shaded (or shielded) from the side wall portions of the recesses for supporting the substrates, the thin film is prevented from being formed on the side wall portions of the recesses. This is advantageous especially if a bias potential is applied through the side wall portions to the substrate.

If the sizes of the rod-like substrates and of the substrate supporters satisfy the following relation, the substrates can be moved freely in the substrate supporters and will not drop outside the substrate supporters even when they are stirred during rotation:

$$L^2 > (m+c)^2 + b^2 - a^2,$$

wherein "L" designates the length of the rod-like substrate, "m" designates the distance between the recesses arranged opposite to each other, "c" designates the depth of each of the recesses, "b" designates the inner diameter of each of the recesses of the substrate supporters, and "a" designates the diameter of the connecting shaft. Therefore, a uniform thin film can be formed on every substrate disposed in the substrate supporters and dropping of the substrates can be prevented.

The above-mentioned combination of the substrates and the substrate supporters can be extended to form a successive series of substrate supporters or a nest of substrate supporters. For example, the above-mentioned substrate supporters can be supported further by another pair of larger supporters in a similar manner. If the length L of the substrate is very short, a plurality of pairs of first substrate supporters satisfying the above-mentioned relation can be manufactured for setting a plurality of substrates between the first substrate supporters. Further, second substrate supporters of a similar shape but of a larger size are manufactured, and the plurality of pairs of the first substrate supporters are supported between the second supporters. If this combination is repeated further in a nesting arrangement, a thin film can be formed on a very large number of substrates, and even if the size of substrates is small, uniform films can be formed without dropping the substrates.

An advantage of the present invention is that a thin film can be formed on substrates by using an apparatus with a compact and simple structure.

Another advantage of the present invention is that the number of substrates processed simultaneously (or the productivity) can be greatly increased.

BRIEF DESCRIPTION OF THE DRAWINGS

These and other objects and features of the present invention will become clear from the following description taken in conjunction with the preferred embodiments thereof with reference to the accompanying drawings, in which:

FIG. 3(a), (b), (c) and (d) are diagrams for illustrating successive movements of substrates when the substrate supporters are rotated;

DETAILED DESCRIPTION OF THE PREFERRED EMBODIMENTS

Figure 1A:
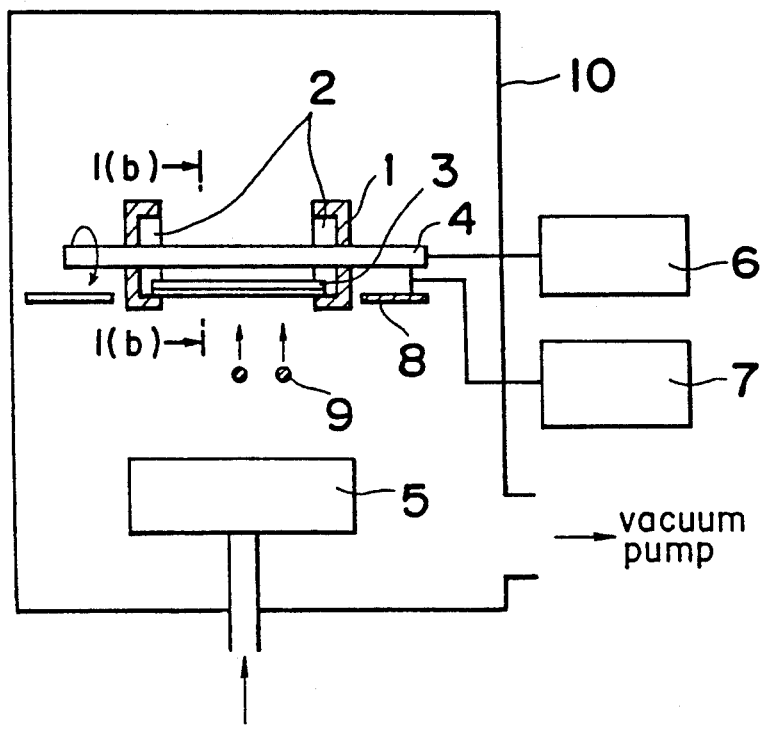
FIG. 1(a) is a schematic perspective view of a thin film forming apparatus according to a first Example of the present invention.

Referring now to the drawings, wherein like reference numerals designate like or corresponding parts throughout the several views, embodiments of the present invention will be described.

EXAMPLE 1

Figure 1B:
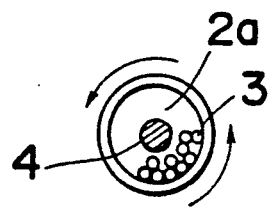
FIG. 1(b) is a sectional view along line 1(b)-1(b) shown in FIG. 1(a)
Figure 2:
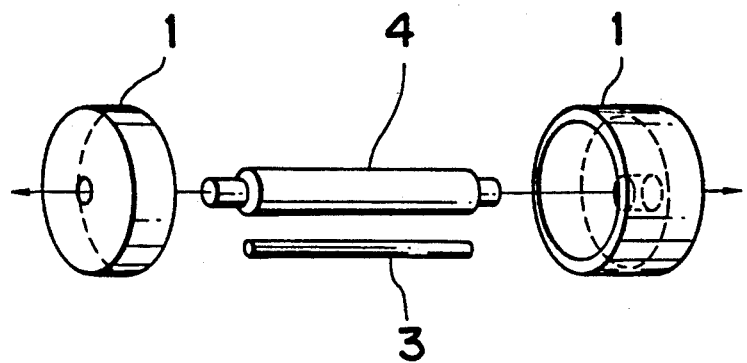
FIG. 2 is a perspective view for illustrating the installation of a substrates in substrate supporters.

FIG. 1(a) shows a schematic perspective view of a thin film forming apparatus of a first Example according to the present invention, while FIG. 1(b) shows a sectional view along line 1(b)—1(b) shown in FIG. 1(a). In FIGS. 1(a) and (b), a substrate 3 is a capstan shaft for driving a magnetic tape used in a videocassette recorder. A thin film of diamond-like carbon will be formed on the outer periphery (or surface) of this cylindrical substrate 3. As shown in detail in FIG. 2, a pair of substrate supporters 1, each having a cylindrical recess 2, are arranged so that the recesses 2 oppose one another and cylindrical substrates 3 are put between the substrate supporters 1. A central shaft 4 connects the substrate supporters 1 directly at the centers of the recesses 2. That is, a ring-shaped groove 2a is formed by the recess 2 and the central shaft 4 in the substrate supporters 1, and the cylindrical substrates 3 are held on the side surface of the groove 2a by the weight of the substrates themselves. Though only one substrate 3 is displayed in FIG. 2, a plurality of substrates 3 can be supported by the substrate supporters 1, as shown in FIGS. 1(a) and (b). The substrate supporters 2 and a material supply 5 are fixed in a vacuum chamber 10 which can be evacuated by a vacuum pump (not shown). The central shaft 4 can be driven by a motor 6, while a direct current power supply 7 is connected to an electrode 8 which is connected further to the central shaft 4.

Benzene as a material gas is introduced from the lower part of the vacuum chamber 10 which has been evacuated to a pressure of $1.0 \times 10^{-3}$ Torr to generate carbon ions at the material supply 5. The substrate supporters 1 are arranged above and opposite the material supply 5. A bias potential is applied to the substrate 3 via the substrate supporters 1 by the direct current power supply 7. Particles 9 or carbon ions are extracted by the action of the bias potential, and a film is formed on the substrates 3.

As explained above, a large amount of substrates 3 can be set very easily in this Example by merely putting them in the substrate supporters 1 guided by the central shaft 4.

FIGS. 3(a)-(d) show the movement of the cylindrical substrates 3 along section line 1(b)—1(b) shown in FIG. 1 when the supporters 1 are rotated. The cylindrical substrates 3 are held at their two ends by their own weights on the side surface of the groove 2a, and a thin film of diamond-like carbon is formed on the outer peripheries of the substrates 3 between their two ends.

The cylindrical substrates 3 are not fixed, but are merely held by their own weight on the side surface of the groove 2a. Therefore, they tend to move in the direction of the rotation of the substrate supporters 1 due to the friction with the side surface of the groove 2a as the supporters 1 are rotated, so that they are dragged upwardly while rotating about their own axes, as illustrated in FIGS. 3(a) and (b).

Then, as displayed in FIGS. 3(c) and (d), after substrates 3 are dragged to a certain height, they either roll down to the lowest part of the cylindrical side surface or pass through a highest position over the central shaft 4 and then roll down to the lowest part.

While the supporters 1 are rotated, the substrates 3 repeat this movement. During this movement, particles 9 of materials fly from below, and a thin film of diamond-like carbon is formed on the outer periphery of each substrate 3 except at the two ends thereof. Further, because the substrates 3 move randomly due to the rotation of the substrate supporters 1 as mentioned above, each portion of each cylindrical substrate 3 has the same probability of having a thin film deposited thereon, such that a uniform film can be formed on the outer peripheries of a plurality of substrates 3 simultaneously.

In order to undergo such movement, the substrates 3 and the substrate supporters 1 need not have circular sections. For example, the cross section of a substrate 3 may be elliptical or polygonal so that the substrates can be rotated according to the rotation of the substrate supporters 1. Further, the substrate may have any shape so long as it can be rotated in the recess. However, when the cross section is circular, the substrate 3 itself can be easily rotated and moved smoothly. Thus, the uniformity of the obtained film is improved further.

In this Example, the two ends of a substrate 3 are guided by the groove 2a of cylindrical shape. Thus, in a series of steps as illustrated in FIGS. 3(a)-(d), the slope angles of the substrates 3 relative to the central shaft 4 is limited to within a certain range such that the substrates are kept roughly in parallel with the central shaft 4. Therefore, the uniformity of the film formed on a circular substrate 3 is improved further.

Further, because the slope angle is limited, the substrates are prevented from dropping through the gap between the opposing substrate supporters 1.

Figure 4A:
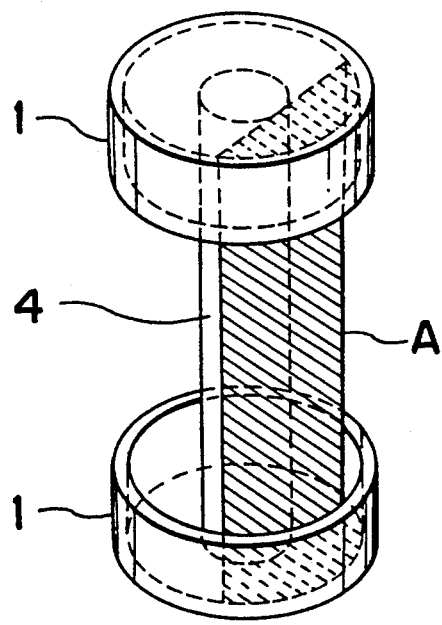
FIGS. 4(a) and (b) are diagrams for illustrating conditions dependent on the size of a substrate.

When the substrate supporters 1 are rotated, a substrate 3 rolls in the substrate supporters 1 and is stirred with other substrates with a slope angle against the rotation direction. With reference to FIGS. 4(a) and (b) for illustrating this situation, a cylindrical substrate 3 moves around in a space V having a side of plane A which is parallel to and makes contact with the central shaft 4.

Figure 4B:
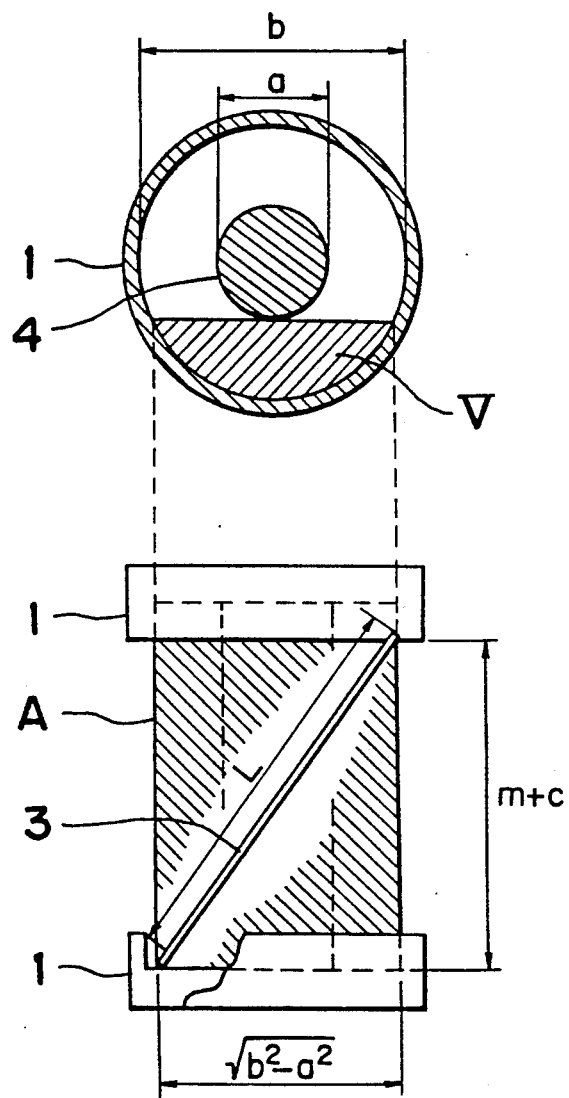

At first, a cylindrical substrate 3 is put in a position in parallel with the central shaft 4. When the substrate 3 is slanted gradually to a position shown in FIG. 4(b), it does not drop if its length L is larger than the maximum length $L_0$ between two points to be realized in the space V. The maximum length $L_0$ is the length of the diagonal of the plane A and can be expressed as follows:

$$L_0 = ((m+c)^2 + b^2 + a^2)^{\frac{1}{2}},$$

wherein "m" designates the distance between the grooves 2a arranged opposite to each other, "c" designates the depth of the groove 2a, "b" designates the inner diameter of the groove 2a of the substrate supporter 1, and "a" designate the diameter of the central shaft 4. Therefore, a condition under which a substrate 3 of length L will not drop is as follows:

$$L > ((m+c)^2 + b^2 - a^2)^{\frac{1}{2}}.$$

A substrate has a volume, and the degree of freedom becomes limited further by the volume. That is, so long as the above-mentioned condition is satisfied, the substrate will not drop from the substrate supporters 1.

Then, if cylindrical substrates 3 are set between the substrate supporters i by adopting the size L satisfying the above condition, they will not drop and a thin film is formed uniformly on every substrate 3.

In this Example, it is clear that little thermal stress is generated in a cylindrical substrate 3 when a thin film is formed. That is, though the temperature of the substrate 3 itself increases due to radiation from the material supply 5 or a heater therefor, the substrate 3 is only supported on the side surface of the grooves 2a and the thermal expansion of the substrate is not restricted at all.

Further, the side surfaces of the grooves 2a of the substrate supporters 1 which make contact with the two ends of the substrates 3 are shaded (or shielded) from the deposition material source in directions along which deposition particles 9 fly. Therefore, because it is difficult for the film to be deposited on the supporting surfaces of the substrates 3, the contact state between the substrates 3 and the inner side surface of the groove 2a can be kept good. When a bias potential is applied via the substrate supporters 1 to the substrates 3 for a long time, a thin film can be applied to the substrates 3 under good conditions. Further, the maintenance period for removing a film deposited on the wall surfaces of the grooves 2a can be lengthened.

Further, the increase in temperature of the substrates 3 is not so high because they are arranged separately from the evaporation source.

As explained above, in this Example, thermal stress is not generated on forming a thin film, and the increase in temperature of the substrate is small, so that the precision of the substrate 3 is deteriorated less compared with that of prior art substrates, and a good film can be formed.

Next, the quality of a thin film of diamond-like carbon applied to a cylindrical substrate 3 and a cylindrical substrate 3 on which a thin film of diamond-like carbon is applied will be explained.

A thin film is manufactured on the surface of cylindrical substrates 3 while a bias potential of $-3$ kV is applied to the substrate supporters 1 from the direct current power supply 7 and the substrate supporters integrated with the shaft 4 are rotated by the motor 6.

First, the number of cylindrical substrates 3 of 2 mm diameter circular cross section to be set in the cylindrical grooves 2a and the uniformity of the thickness of a film deposited on the surface of cylindrical substrates 3 are investigated.

Figure 5:
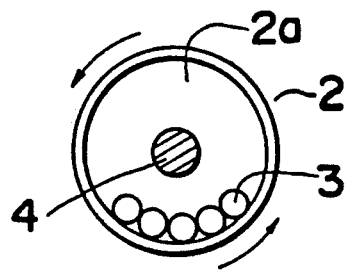
FIGS. 5(a), (b), (c) and (d) are diagrams wherein 5, 20, 35 and 50 substrates are set in the substrate supporters, respectively.
Figure 5:
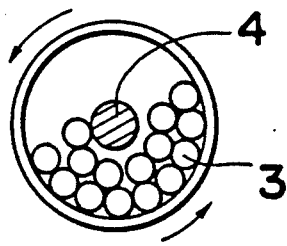
Figure 5:
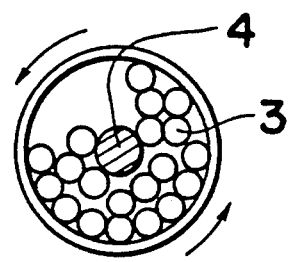
Figure 5:
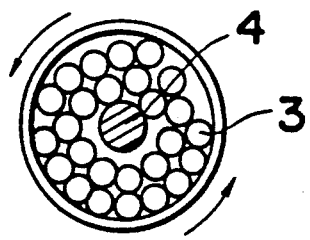

Experiments are performed in four cases wherein the number of substrates is 5, 20, 35 and 50, as displayed schematically in FIGS. 5(a), (b), (c) and (d), respectively.

After a thin film of diamond-like carbon is formed on the surface of cylindrical substrates 3, the film thickness is measured at several points on the surface of each substrate 3 to check the distribution of film thickness. Table 1 shows the results of the measurement.

TABLE 1

| number of substrates | 5 | 20 | 35 | 50 |
|---|---|---|---|---|
| distribution of film thickness | ±5 | ±5 | ±5 | ±20 |

As displayed in Table 1, when the number of substrates 3 is fifty (FIG. (d)), the thickness of the film formed on the cylindrical substrates 3 becomes scattered (non-uniform). In this case, many substrates 3 are put in the grooves 2a and they cover even the central shaft 4. The nonuniformity of the film thickness is ascribable to the fact that the substrates 3 around the central shaft 4 do not shift their positions equally such that the probability that a particular region will have a film formed thereon becomes different for each substrate.

Therefore, in order to form a film of uniform thickness, it is desirable to determine the number of substrates so that each substrate 3 will have the same probability of moving to the film-forming region. It is found that such condition can be satisfied if the number of substrates 3 is not so large as to cover the central shaft 4. In cases in which the number of substrates 3 is 5, 20 and 35 (FIGS. 5(a), (b) and (c)), when the substrate supporters 1 are rotated from the stationary state, all the substrates 3 are stirred according to the rotation of the substrate supporters 1 and each substrate 3 has the same probability of repetitively moving to the film-forming region to form a uniform film.

Next, in order to investigate the relationship between the size of the substrate supporters 1 and the falling of the substrates from the supporters 1, five sizes of substrate supporters are prepared, and thirty-five substrates 3 are set in the substrate supporters 1 to form a thin film. Table 2 summarizes the data of sizes "A"–"E" of the substrate supporters 1 and the number of substrates 3 which fall from the substrate supporters 1 for each size.

TABLE 2

| | kind of substrate | | | | |
|---|---|---|---|---|---|
| | A | B | C | D | E |
| size of substrate supporter | | | | | |
| b (mm) | 13 | 13 | 18 | 13 | 15 |
| a (mm) | 8 | 8 | 12 | 6 | 4 |
| c (mm) | 3 | 3 | 3 | 5 | 5 |
| m (mm) | 24 | 26 | 26 | 21 | 21 |
| L (mm) | 29 | 29 | 29 | 29 | 29 |
| number of fallen substrate | 0 | 19 | 8 | 0 | 16 |

Only in the cases of substrate supporters "A" and "D" did no substrates fall, such that a uniform thin film could be formed on every substrate 3. On the contrary, in cases in which substrates 3 fell, they fell on the ion source 5 to prevent release of ions. Thus, in these cases the film was not formed normally and the film was not formed uniformly even on the substrates remaining in the substrate supporters 1.

Next, the data will be explained in connection with the thickness of films obtained by using the above-mentioned substrate supporters "A" shown in Table 2 supporting thirty-five substrates 3. Table 3 summarizes the film thickness data on ten substrates arbitrarily removed from the thirty-five substrates in ten cases "A"–"J". The scattering of the data on the film thickness is within ±5% in each of the cases "A"–"J", and each substrate has a uniform film thickness.

TABLE 3

| substrate | film thickness (Å) | substrate | film thickness (Å) |
|---|---|---|---|
| A | 1850 | F | 1860 |
| B | 1950 | G | 1950 |
| C | 1920 | H | 1840 |
| D | 1900 | I | 1880 |
| E | 1850 | J | 1900 |

Next, the quality of the film is examined. Two cylindrical substrates 3 which constitute capstan shafts for a videocassette recorder are manufactured and are provided with a thin film of diamond-like carbon by using the apparatus according to the present Example and by using a prior art apparatus which will be explained below, respectively. The quality of the film is evaluated by determining the amount of friction of the film, which is measured by pressing a magnetic tape against the surface of the substrate 3 with a rubber roller under a constant tension for five hundred hours. The pressing force of the roller is 1.4 kg. Table 4 compiles the data.

Figure 6:
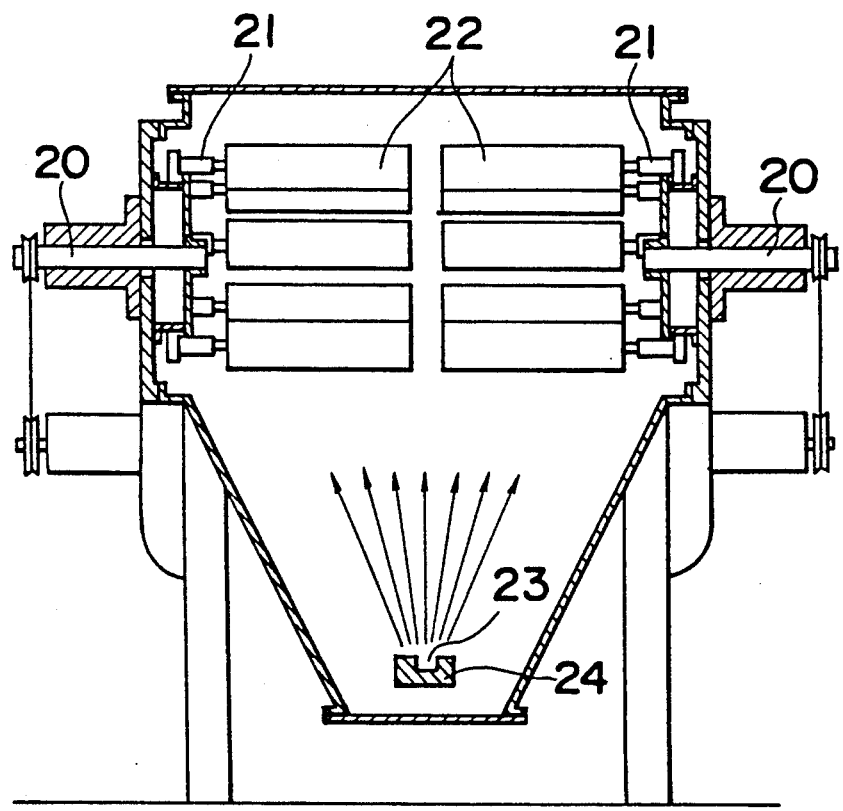
FIG. 6 is a schematic view of a prior art barrel coating apparatus.

FIG. 6 shows the above-mentioned prior art apparatus according to Japanese Utility Model laid open Publication 57955/1990 which is used for comparison experiments summarized in Table 4 and other tables. In this ion plating apparatus, many substrates 22 are attached to either of a pair of holders 21 which are fixed around the ends of drive shafts 20. These holders 21 are revolved around the central axis of the drive shafts 20 according to the rotation of the drive shafts 20 while also rotating around their own axes at the same time via planet gear mechanisms. Evaporation material 23 is supplied from a crucible 24. Thus, a uniform thin film is formed on every substrate. In the comparison experiments, cylindrical substrates 3 are fixed instead of the substrates 22 as mentioned above.

As shown in Table 4, it is confirmed that a quality similar to that of the prior art can be obtained.

TABLE 4

| | apparatus | | | |
|---|---|---|---|---|
| | prior art | | this invention | |
| amount of friction (μm) | substrate | | substrate | |
| | A | 0.07 | C | 0.07 |
| | B | 0.09 | D | 0.09 |

Next, Table 5 compiles the data on bending of the substrates 3 due to the film-forming process. The capstan shafts for videocassette recorders used as substrates 3 are subject to a process to remove strain before the process.

TABLE 5

| | apparatus | | | |
|---|---|---|---|---|
| | prior art | | this invention | |
| amount of friction (μm) | substrate | | substrate | |
| | A | 1.5 | C | 0.1 |
| | B | 1.4 | D | 0.1 |

As to the two samples prepared by the prior art apparatus, the bending is more than 1 μm. On the contrary, as to the two samples prepared in this Example, the bending is 0.1 μm.

As explained above, it is confirmed in this Example that the precision can be maintained even after a thin film is formed, and that the precision can be largely improved.

The deviation from the straightness of the capstan shafts of the videocassette recorders is required to be about 0.8 μm or less in order to run the tape at a constant speed. Therefore, this Example is found especially advantageous for precise manufacture of such a component.

Next, the productivity of the apparatus of this Example and of the prior art apparatus will be discussed. A film with a thickness of 2000 Å of a diamond-like carbon is formed on a capstan shaft as a substrate, and the deposition rate (Å/min), the time required for forming the film, and the number of processed substrates per operation cycle are obtained and the number of processed substrates per hour is calculated. Table 6 summarizes the data. It is found that the productivity is improved by about six times compared with the prior art apparatus.

TABLE 6

| | apparatus | |
|---|---|---|
| | prior art | this invention |
| deposition rate (Å/min) | 66 | 44 |
| time needed (min) | 30 | 56 |
| number of processed substrates | 3 | 35 |
| number of processed substrate per hour | 6 | 37.5 |

EXAMPLE 2

Figure 7A:
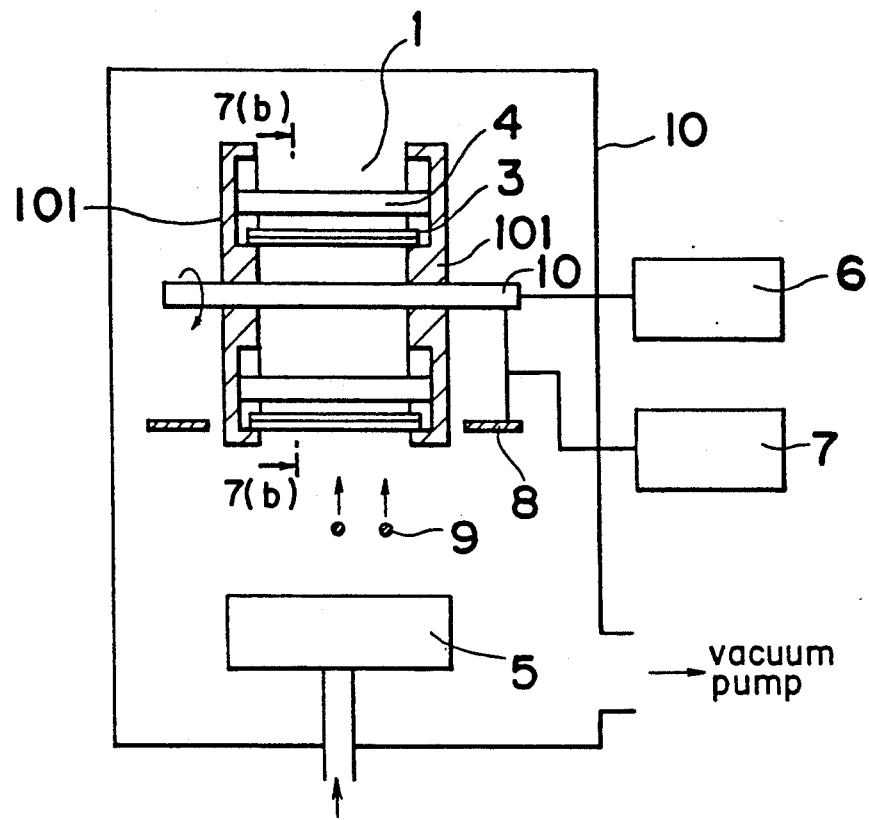
FIG. 7(a) is a schematic perspective view of a thin film forming apparatus according to a second Example of the present invention.
Figure 7B:
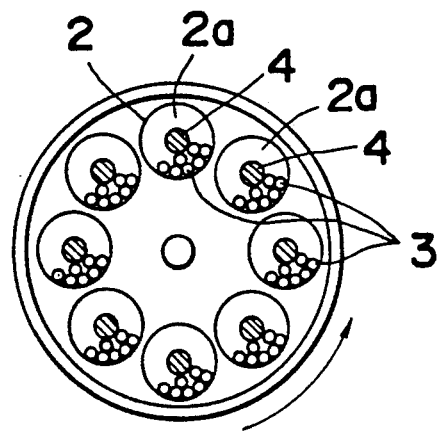
FIG. 7(b) is a sectional view along line 7(b)-7(b) shown in FIG. 7(a)

Next, a second Example of an apparatus according to the present invention will be explained below. FIG. 7(a) shows schematically the structure of the apparatus. Elements having the same function as the counterparts of Example 1 have the same reference numerals and detailed explanations thereof will be omitted. FIG. 7(b) illustrates a cross section taken along line 7(b)—7(b) in FIG. 7(a).

Figure 8:
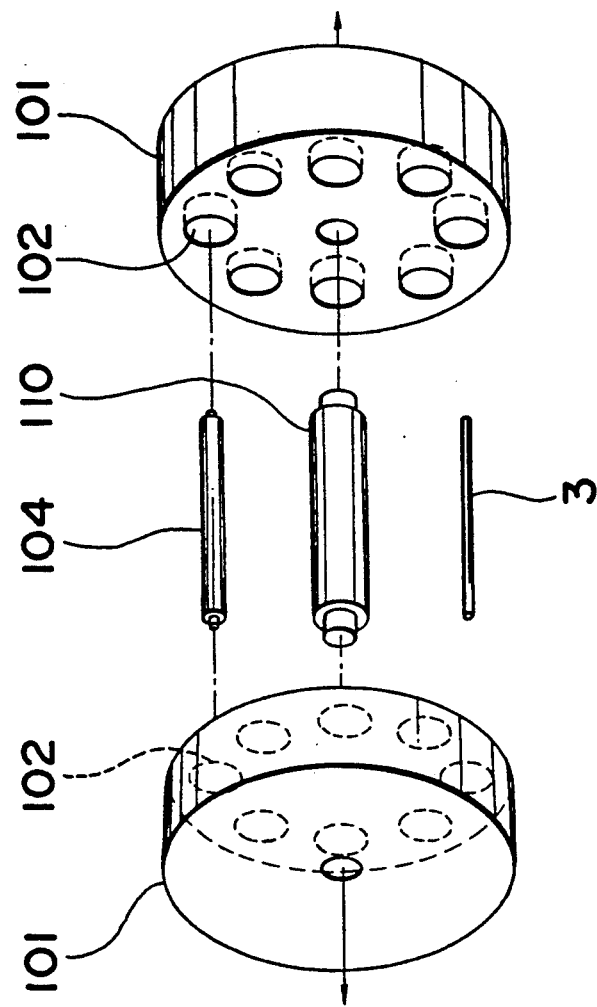
FIG. 8 is a perspective view for illustrating the installation of a substrate in substrate supporters.

Two substrate supporters 101 are arranged above a material supply 5. As illustrated in detail in FIG. 8, a substrate supporter 101 has eight circular recesses 102 having a cylindrical side wall similar to the recess 2 in Example 1. A pair of the substrate supporters 101 are arranged so that the recesses 102 of one of the supporters 101 are opposed to the counterpart recesses of the other, and eight central axes (or shafts) 104 of 8 mm diameter are set at the center positions of the respective recesses 102. The central axes 104 help to keep the substrates 3 parallel to each other when the substrate supporters 101 are rotated.

Thirty-five substrates 3 are put in each recess 102 and a total of two hundred eighty substrates are put between the substrate supporters 101 connected by a shaft 110. Then, a thin film of diamond-like carbon is formed on the cylindrical substrates 3 under the same conditions as in Example 1. The data are compared with the prior art data.

First, the uniformity of the film is examined. Three substrates are extracted arbitrarily from the substrates and the film thicknesses thereof are examined. It is found that the scattering is ±5% or less, and this shows that the film is formed uniformly.

Next, the quality of film is evaluated by using the same evaluation method. The evaluation results of two substrates extracted arbitrarily from the substrates are summarized in Table 7 as well as those of two substrates obtained with the prior art apparatus. The amount of friction is of the same order between the two apparatuses and it is confirmed that the quality of film obtained in this Example is equal to that of the prior art.

TABLE 7

| | apparatus | | | |
|---|---|---|---|---|
| | prior art | | this invention | |
| amount of friction (μm) | substrate A | 0.07 | substrate C | 0.08 |
| | B | 0.09 | D | 0.08 |

Next, Table 8 compiles the results on the bending of the substrates 3 after the film-forming process. As to two samples prepared by the prior art apparatus, the bending is more than 1 μm. On the contrary, as to two samples prepared in this Example, the bending is 0.1 μm. That is, when the apparatus of this Example is used, the deviation from straightness does not change at all after the film forming process. Therefore, it is confirmed that the precision can be improved to a large extent when compared with the prior art.

TABLE 8

| | apparatus | | | |
|---|---|---|---|---|
| | prior art | | this invention | |
| amount of bending (μm) | substrate A | 1.5 | substrate C | 0.1 |
| | B | 1.4 | D | 0.1 |

Then, the productivity of the apparatus of this Example is compared with that of prior art, as in Example 1. It is found that the number of processed substrates per hour increases by about twenty times compared with the prior art method.

TABLE 9

| | apparatus | |
|---|---|---|
| | prior art | this invention |
| deposition rate (Å/min) | 66 | 16 |
| time needed (min) | 30 | 150 |
| processed number | 3 | 280 |
| processed number per hour | 6 | 112 |

As explained above, in this Example, the quality and the uniformity of the film can be kept the same as in the prior art, while the number of processed substrates can be increased remarkably.

EXAMPLE 3

Figure 9A:
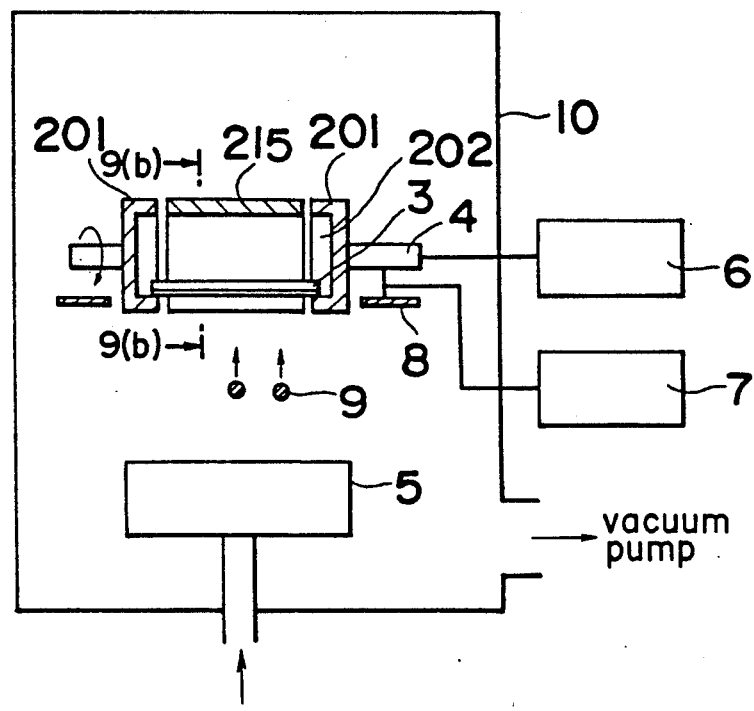
FIG. 9(a) is a schematic perspective view of a thin film forming apparatus according to a third Example of the present invention.
Figure 9B:
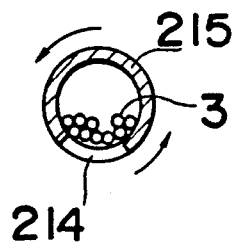
FIG. 9(b) is a sectional view along line 9(b)—(b) shown in FIG. 9(a)

FIG. 9(a) schematically displays the structure of a third Example of an apparatus according to the present invention, and FIG. 9(b) shows a section along line 9(b)—9(b) in FIG. 9(a). This Example differs from Example i as follows: First, a cylindrical cover 215 having a window 214 opposite to a material supply 5 is provided between two opposing substrate supporters 201. On the other hand, the central shaft 4 is not used, and the substrate supporters 201 are driven to rotate at the same rate by a synchronous mechanism (not shown).

In this Example, particles 9 for forming a film contact a cylindrical substrate 3 after moving through the window 214 of the cover 215.

Because the cover 215 is provided in this Example, substrates 3 are supported on the inside surface of recesses 202 and are disposed in the cover 215, while the material supply 5 is arranged outside the cover in contrast to a prior art barrel coating apparatus. Therefore, the increase in temperature of the substrates 3 observed in the prior art apparatus can be avoided. Further, because the inside surface of the cover 215 is covered by the substrates 3, vapor rarely deposits on the inside surface.

In Examples 1 and 2, vapor deposits only slightly on the inside surfaces of the recesses 2 in which the substrates 3 are supported and this deposition can be practically neglected. However, because the cover 215 is provided in this Example, the deposition of vapor on the inside surface can be decreased further.

Further, if the substrate supporters 201 are rotated at an appropriate slow rotation rate, the cylindrical substrates 3 can be kept roughly in parallel with each other even though the central shaft 4 is not used in this Example. Thus, a good film can be formed.

Next, the quality of the thin film of diamond-like carbon applied to the cylindrical substrate 3, and the cylindrical substrate 3 on which the thin film of diamond-like carbon is applied will be explained.

First, the uniformity of thickness of the films deposited on the surfaces of the cylindrical substrates 3 are investigated. After thin films of diamond-like carbon are formed on the surfaces of thirty-five cylindrical substrates 3, the film thickness distribution is measured at the center area and two other areas at the side on the surface of three substrates arbitrarily removed from the thirty-five substrates. It is found that the distribution of film thickness is within ±5% in a sample.

Further, Table 10 shows film thickness data of ten substrates arbitrarily removed from the thirty-five substrates. The distribution of film thickness among the samples "A"–"J" is within ±5%. Thus, it is found that films are formed uniformly among the samples.

TABLE 10

| substrate | film thickness (Å) | substrate | film thickness (Å) |
|---|---|---|---|
| A | 1850 | F | 1860 |
| B | 1900 | G | 1950 |
| C | 1920 | H | 1840 |
| D | 1900 | I | 1880 |
| E | 1850 | J | 1880 |

Next, the quality of the film is examined. Cylindrical substrates 3 as capstan shafts for videocassette recorders are manufactured to have a thin film of diamond-like carbon both by using the apparatus according to the present example and by using the above-mentioned prior art apparatus. The quality of film is evaluated by determining the amount of friction of the film, which is measured by pressing a magnetic tape against the surface of the substrates 3 with a rubber roller under a constant tension for five hundred hours. The pressing force of the roller is 1.1 kg.

Table 11 shows the results for two substrates for each of the manufacturing methods. The amount of friction is about the same between the two manufacturing methods, and it is confirmed that a quality similar to the prior art quality can be obtained.

TABLE 11

| | apparatus | | | |
|---|---|---|---|---|
| | prior art | | this invention | |
| amount of friction (μm) | substrate | | substrate | |
| | A | 0.07 | C | 0.08 |
| | B | 0.09 | D | 0.08 |

Next, the bending of the substrates 3 is examined. Table 12 compiles the results on the bending of two substrates after the film-forming process. The substrates are subjected to remove strain before the film forming process. As to the two samples prepared by the prior art apparatus, the bending was more than 1 μm. On the contrary, as to the two samples prepared in this Example, the bending was 0.1 μm. That is, when the apparatus of this Example is used, the deviation from the straightness does not change at all after the film forming process. Therefore, it is confirmed that the precision can be improved to a large extent when compared with the prior art.

TABLE 12

| | apparatus | | | |
|---|---|---|---|---|
| | prior art | | this invention | |
| amount of bending (μm) | substrate | | substrate | |
| | A | 1.5 | C | 0.1 |
| | B | 1.4 | D | 0.1 |

When the material of the film to be formed on the substrate 3 is a high electrical resistance material such as diamond-like carbon, the deposition of such material on the cover may cause instability in the film forming process, and damage due to discharges occur in the prior art barrel coating apparatus. However, such problems can be solved in this Example as well as in the other Examples.

The material of the substrate supporters 1, 101, 201 will be explained below.

If a film to be formed is made of a diamond-like carbon, the material of the side surface of the groove 2a or the like for supporting substrates 3 is preferably brass, gold or silver. Because a diamond-like carbon is difficult to adhere to these materials, the side surface of the groove 2a on the like can be kept in a clean state with little film adhering thereto. Thus, an electrical bias voltage can be suitably applied via the side surface to the substrates 3.

For example, the situation in Example 1 will be explained below.

Four cases wherein the side surface of the groove 2a is plated with gold, silver and brass and is made of stainless steel are examined. The film-forming conditions of the diamond-like carbon are the same as in Example 1, and fifty cycles are carried out by using the four kinds of substrate supporters 1, 101, 201. A change in the electrically conducting state is observed between the substrate supporters 1, 101, 201 and the substrates 3 as time passes.

Figure 10:
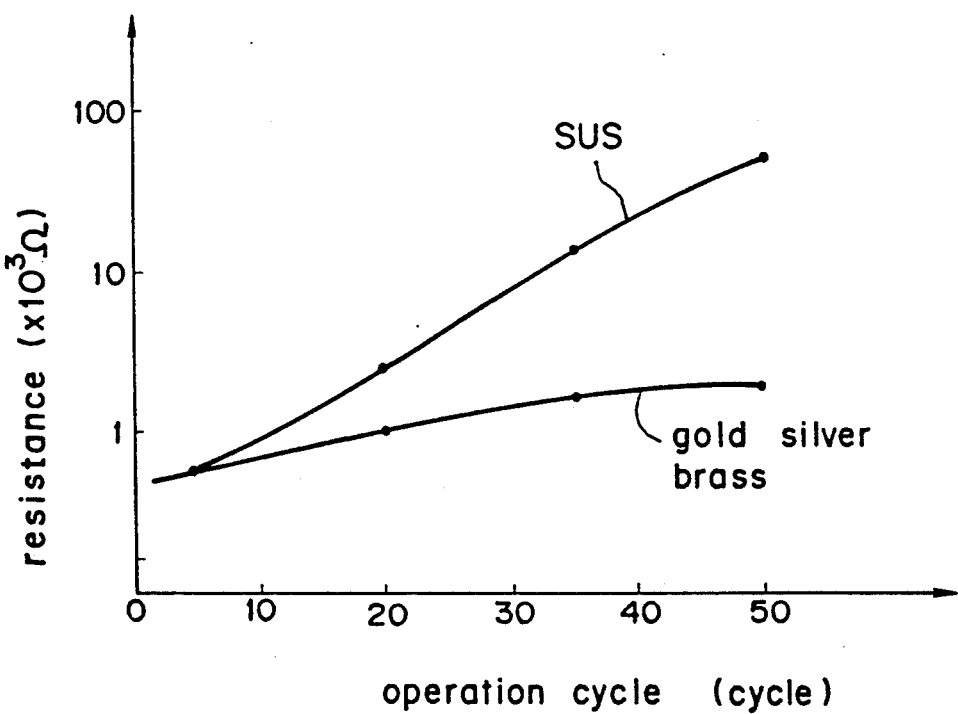
FIG. 10 is a graph of the resistance between the substrates and the substrate holders plotted against operation cycles.

FIG. 10 shows the resistance between the substrate supporters and the substrates as the number of operation cycles of the apparatus is increased. If the substrate supporters 1, 101, 201 are made from stainless steel, the resistance increases to 20 kΩ when the operation cycles becomes thirty-five. The resistance drop in bias potential due to the existence of the resistance is about 200 V, and this makes it difficult to apply an effective bias potential.

On the contrary, if the side surfaces of the substrate supporters 1, 101, 201 are plated with brass, gold or silver, the resistance increases a little with increase in the number of operation cycles. However, the resistance drop in bias potential due to the existence of the resistance is only about 10 V, which has little affect on the film-forming operation, such that good electrical conductance is maintained.

Further, Table 13 summarizes the quality of film by using the above-mentioned friction test. If the substrate supporters 1, 101, 201 are made from stainless steel, there is a tendency for the electrical resistance of the film quality to deteriorate. On the contrary, if the side surface of the substrate supporters 1, 101, 201 are plated with brass, gold or silver, the film quality is not ascertainably changed.

TABLE 13

| number of operation cycle | amount of friction when SUS supporters are used (μm) | amount of friction when gold plating is used (μm) | amount of friction when sliver plating is used (μm) | amount of friction when brass supporters are used (μm) |
|---|---|---|---|---|
| 5 | 0.07 | 0.07 | 0.07 | 0.07 |
| 10 | 0.07 | 0.07 | 0.07 | 0.07 |
| 15 | 0.07 | 0.07 | 0.07 | 0.07 |
| 20 | 0.07 | 0.07 | 0.07 | 0.07 |
| 25 | 0.07 | 0.07 | 0.07 | 0.07 |
| 30 | 0.07 | 0.07 | 0.07 | 0.07 |
| 35 | 0.15 | 0.07 | 0.07 | 0.07 |
| 40 | 0.20 | 0.07 | 0.07 | 0.07 |
| 45 | 0.20 | 0.07 | 0.07 | 0.07 |
| 50 | 0.20 | 0.07 | 0.07 | 0.07 |

The fact that the film quality is affected by the material of the side surfaces of the grooves 2a is ascribable to the amount of film adhered to the size surfaces on which the substrates 3 are supported. When substrate supporters 1, 101, 201 are made from stainless steel, it is observed that the amount of film adhered to the surface increases with an increase in the number of operation cycles. On the contrary, in the other cases, it is observed that only carbon powdered is adhered slightly and the carbon can be wiped out easily with a clot. Therefore, if at least the side surfaces of the grooves are made from gold, silver or brass, a film adhered to the surface can be removed easily and the maintenance of the apparatus becomes easy. It is to be noted that an alloy material of gold, silver or copper can realize a similar effect to that of pure gold or the like.

EXAMPLE 4

Figure 11A:
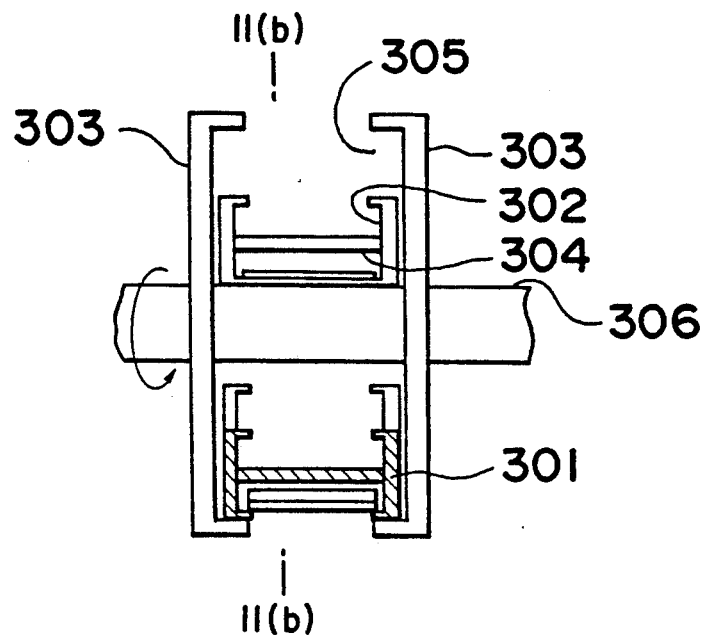
FIG. 11(a) is a schematic perspective view of a thin film forming apparatus according to a fourth Example of the present invention.
Figure 11B:
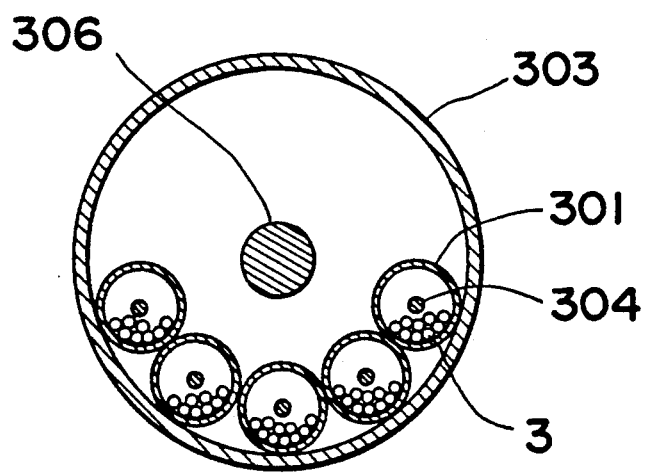
FIG. 11(b) is a sectional view along line 11(b)—11(b) shown in FIG. 11(a)

Next, a fourth Example of an apparatus according to the present invention will be explained below. FIG. 11(a) shows schematically the structure of the apparatus. Elements having the same function as the counterparts of Examples 1 and 2 shown in FIGS. 1, 2, 7 and 8 have the same reference numerals and detailed explanation of them will be omitted. FIG. 11(b) illustrates a cross section taken along line 11(b)—11(b) shown in FIG. 11(a).

A plurality of substrates 3 are set in first substrate supporter 301 similar to the substrate supporters 1 in Example 1, and the first substrate supporters 301 are connected by central shafts 304. The outside surfaces of the first substrate supporters 301 are cylindrical and a plurality of pairs of the first substrate supporters 301 are supported in a pair of second substrate supporters 303 which are similar in structure to the first substrate supporters 301 but are larger. The two second substrate supporters 303 are arranged so that the grooves 305 are opposed to each other and are connected by a shaft 306 disposed at the center of the grooves 305 as with the substrate supporters 1 in Example 1. Such a series connection of substrate supporters is arranged above a material supply 5 (not shown). Then, as illustrated in detail in FIG. 11(b), when the second substrate supporters 303 are driven to be rotated, the first substrate supporters 301 rotate in the grooves 305 of the second substrate supporters 303 and the substrates 3 disposed in the grooves 302 of the first substrate supporters 301 rotate in the first substrate supporters 301.

A film of diamond-like carbon is formed on the cylindrical substrates 3 in the apparatus of this Example. Thirty substrates are set in first substrate supporters 301 and six pairs of first substrate supporters 301 are set in the second substrate supporters 303. Thus, a film is formed on a total of one hundred and eighty substrates 3.

In order to investigate the relationship between the sizes of first substrate supporters 301 and the falling of substrates 3, five sizes of first substrate supporters are prepared, and thirty-five substrates 3 are set in the substrate supporters 301 to form a thin film on the substrates. Table 14 summarizes the data for the sizes "A"–"E" of the first substrate supporters 301 and the number of substrates which fall from the substrate supporters 301.

TABLE 14

|  | kind of substrates | | | | |
| --- | --- | --- | --- | --- | --- |
|  | A | B | C | D | E |
| size of supporter | | | | | |
| b (mm) | 5 | 7 | 8 | 3 | 5 |

TABLE 14-continued

|  | kind of substrates | | | | |
| --- | --- | --- | --- | --- | --- |
|  | A | B | C | D | E |
| a (mm) | 3 | 3 | 5 | 1 | 2 |
| c (mm) | 2 | 3 | 3 | 3 | 2 |
| m (mm) | 8 | 8 | 8 | 4 | 5 |
| L (mm) | 11 | 11 | 11 | 8 | 8 |
| number of fallen substrates | 0 | 111 | 89 | 0 | 96 |

Only in the cases of substrate supporters "A" and "D", did no substrates 3 fall, such that a uniform thin film could be formed on every substrate 3.

Similarly, the falling of the first substrate supporters 301 from the second substrate supporters 303 is examined by using three sizes "A"–"C" of second substrate supporters with the first substrate supporters of size "A".

TABLE 15

|  | kind of substrate | | |
| --- | --- | --- | --- |
|  | A | B | C |
| size of supporter | | | |
| $b_2$ (mm) | 7 | 7 | 8 |
| $a_2$ (mm) | 5 | 5 | 4 |
| $c_2$ (mm) | 3 | 6 | 4 |
| $m_2$ (mm) | 20 | 20 | 20 |
| $L_1$ (mm) | 25 | 25 | 24 |
| drop of supporter | no | yes | yes |

Only in the case of second substrate supporters "A", did no first substrate supporters fall, such that a uniform thin film could be formed on every substrate 3.

Then, a film is formed in the following experiments under conditions in which substrates 3 and first substrate supporters 301 do not fall.

The quality of the film of diamond-like carbon formed on the substrates 3 will be explained.

First, the uniformity of film is examined. Table 16 summarizes the film thickness data of ten substrates "A"–"J" extracted arbitrarily from thirty substrates. It is found that the scattering is ±5% or less, and this shows that the films are formed uniformly.

TABLE 16

| kind of substrate | film thickness (Å) | kind of substrate | film thickness (Å) |
| --- | --- | --- | --- |
| A | 1850 | F | 1860 |
| B | 1950 | G | 1950 |
| C | 1920 | H | 1840 |
| D | 1900 | I | 1880 |
| E | 1850 | J | 1900 |

Next, the quality of film is evaluated by using the above-mentioned evaluation method. The results for two substrates extracted arbitrarily from the thirty are summarized in Table 17 as well as the results for two substrates obtained with the prior art apparatus. The amount of friction is of the same order for each of the two apparatuses, and it is confirmed that the quality of film obtained in this Example is equal to that of prior art.

TABLE 17

|  | methof of forming film | | | |
| --- | --- | --- | --- | --- |
|  | prior art | | this invention | |
| amount of friction (μm) | substrate | | substrate | |
|  | A | 0.07 | C | 0.08 |
|  | B | 0.09 | D | 0.08 |

Next, the deviation from circularity of the substrates is measured, and the bending of the substrates 3 is compared with that of substrates from the prior art apparatus. Table 17 compiles the results for the bending of the substrates after the film-forming process. As to the two samples prepared by the prior art apparatus, the bending is more than 1 μm. On the contrary, as to the two samples prepared in this Example, the bending is 0.1 μm. That is, when the apparatus of this Example is used, the precision does not change at all during the film-forming process. Therefore, it is confirmed that the precision can be improved to a large extent when compared with prior art.

TABLE 18

| amount of bending (μm) | method of forming film | | | |
|---|---|---|---|---|
| | prior art | | this invention | |
| | substrate | | substrate | |
| | A | 1.5 | C | 0.1 |
| | B | 1.4 | D | 0.1 |

Then, the productivity of the apparatus of this Example is compared with that of prior art, as in Example 1. Table 19 summarizes the results for the productivity. It is found that the number of processed substrates per hour increases by about twenty times compared with the prior art method.

TABLE 19

| | method of forming film | |
|---|---|---|
| | prior art | this invention |
| deposition rate (Å/min) | 66 | 16 |
| time needed (min) | 30 | 150 |
| processed number | 3 | 280 |
| processed number per hour | 6 | 112 |

Thus, the number of processed substrates can be greatly increased while keeping the quality and uniformity of film the same, even if the size of a substrate is small.

In the above-mentioned Example, the film is formed on the substrates by using two pairs of first substrate supporters. However, three pairs or more of first substrate supporters may also be used.

The material of the substrate supporters 301 will be explained below.

If the film to be formed is made of diamond-like carbon, the material of the inner surface of the grooves 2a of the first substrate supporters 301 is preferably brass, gold or silver. Because diamond-like carbon does not readily adhere to if these materials, the side surfaces of the grooves 2a can be kept in a clean state wherein little film adheres to the surface. Thus, a bias potential can be suitably applied via the side surfaces to the substrates 3.

Four cases wherein the side surfaces of the grooves 2a are plated with gold, silver and brass and are made of stainless steel are examined. The conditions for forming diamond-like carbon film are the same in Example 1, and fifty cycles are carried out by using the four kinds of substrate supporters 301. A change in the electrically conducting state is observed between the substrate supporters 301 and the substrates 3 as time passes.

Figure 12:
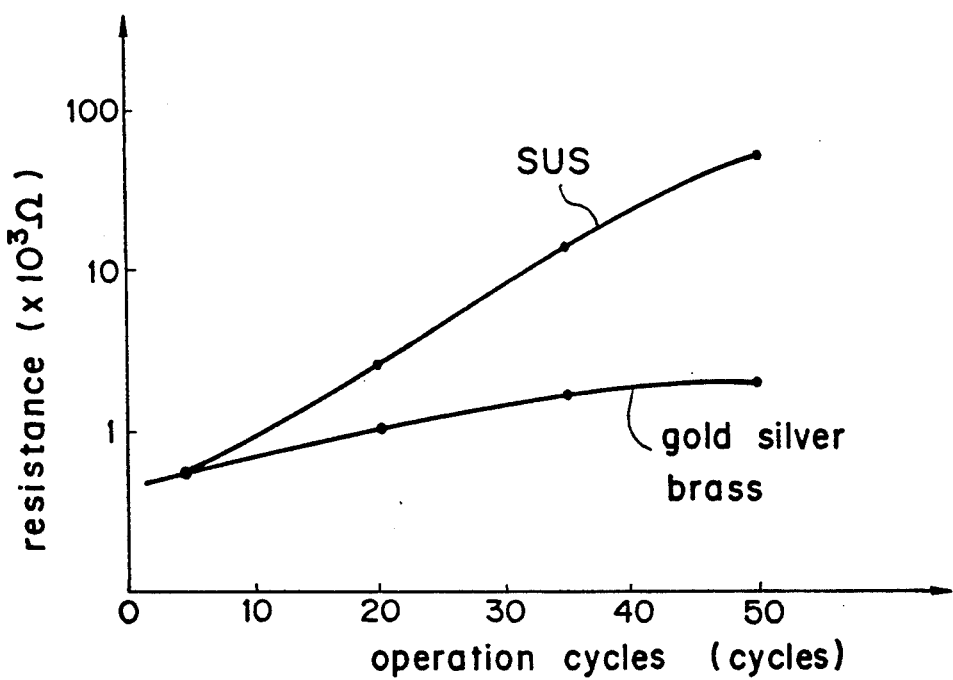
FIG. 12 is graph of the resistance between the substrates and the substrate holders plotted against operation cycles.

FIG. 12 shows the resistance between the substrate supporters and the substrates as the number of operation cycles of the apparatus is increased. If the substrate supporters 301 are made from stainless steel, the resistance increases to 20 kΩ at thirty-five operation cycle. The resistance drop in bias potential due to the existence of the resistance is about 200 V, and this makes it difficult to apply an effective bias potential. On the contrary, if the side surfaces of the substrate supporters 1 are plated with brass, gold or silver, the resistance increases little with increase in the number of operation cycles. However, the resistance drop in bias potential due to the existence of the resistance is only about 10 V, and this has little affect on the film-forming operation as good electrical conductance is maintained.

Further, Table 20 summarizes the quality of film by using the above-mentioned friction test. If the first substrate supporters 301 are made from stainless steel, there is a tendency for the film quality to deteriorate according to the electrical resistance. On the contrary, if the inside surfaces of the substrate supporters 301 are plated with brass, gold or silver, the film quality is not perceptibly changed.

TABLE 20

| number of operation cycles | amount of friction when SUS supporters are used (μm) | amount of friction when gold plating is used (μm) | amount of friction when silver plating is used (μm) | amount of friction when brass supporters are used (μm) |
|---|---|---|---|---|
| 5 | 0.07 | 0.07 | 0.07 | 0.07 |
| 10 | 0.07 | 0.07 | 0.07 | 0.07 |
| 15 | 0.07 | 0.07 | 0.07 | 0.07 |
| 20 | 0.07 | 0.07 | 0.07 | 0.07 |
| 25 | 0.07 | 0.07 | 0.07 | 0.07 |
| 30 | 0.07 | 0.07 | 0.07 | 0.07 |
| 35 | 0.15 | 0.07 | 0.07 | 0.07 |
| 40 | 0.20 | 0.07 | 0.07 | 0.07 |
| 45 | 0.20 | 0.07 | 0.07 | 0.07 |
| 50 | 0.20 | 0.07 | 0.07 | 0.07 |

The fact that the film quality is affected by the material of the side surfaces of the grooves 302a is ascribable to the amount of the film adhered to the inner surface on which substrates 3 are supported, as explained above after Table 13. Therefore, if at least the side surfaces of the grooves are made from gold, silver or brass, a film adhered to the side surfaces can be removed easily and the maintenance of the apparatus becomes easy. It is to be noted that an alloy material of gold, silver or copper can be utilized to attain an effect similar to that for pure gold or the like.

Further, this type of combination can be extended to a nesting arrangement of substrate supporters. That is, a pair of (n+1)-th substrate supporters, each having an (n+1)-th recess, supports the ends of a plurality of n-th substrate supporters. A pair of the innermost substrate supporters supports a plurality of cylindrical substrates. A pair of the outermost substrate supporters can be driven to be rotated. As the outermost substrate supporters are driven, the cylindrical substrates as well as the other substrate supporters are rotated, and a thin film can be formed uniformly on the substrates.

In order to prevent the dropping of substrates and nested substrate supporters, the length $L_n$ of the n-th substrate supporter (wherein zeroth substrate supporter designates the rod-like substrate), the inner diameter $b_n$ of the n-th recess, the depth $c_n$ of the n-th recess, the diameter of $a_{n+1}$ of the n-th connecting shaft and the distance $m_n$ between the n-th recesses arranged opposite to each other satisfy the following relation:

$$L_n^2 > (m_{n+1} + c_{n+1})^2 b_{n+1}^2 - a_{n+1}^2.$$

In the above-mentioned Examples, the substrates 3 are cylindrical. However, the present invention is not limited to cylindrical substrates. For example, substrates having for example polygonal sections may also be used.

Further, the shape of the recesses of the substrate supporters for rotating the substrates is not limited to that which has a cylindrical wall portion. For example, the shape may be elliptical or polygonal so that the substrates can be rotated on the wall portion.

Further, particles for depositing a film 9 are ions in the above-mentioned examples. However, other film-forming techniques such as deposition or sputtering may be used. Still further, the material of a thin film to be deposited is not limited to a diamond-like carbon, and other materials such as a metal of aluminum, gold or the like or a compound of $TiO_2$, $SiO_2$, TiC or the like may also be used.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for forming a film on an elongated substrate having opposing ends and a first rotational axis extending therethrough along a length thereof, said method comprising the steps of:
   providing a pair of substrate supporters, each of said substrate supporters having a recess formed therein;
   arranging said substrate supporters such that said recesses formed therein, respectively, confront one another and such that said substrate supporters are rotatable about a second rotational axis extending through both of said recesses;
   disposing the opposing ends of the elongated substrate in the recesses of the substrate supporters, respectively, such that the elongated substrate is loosely supported on inner peripheral surfaces of said substrate supporters and between the substrate supporters;
   rotating said substrate supporters simultaneously about said second rotational axis such that the elongated substrate is caused to rotate about said first rotational axis while the opposing ends of the elongated substrate are supported in said recesses of said substrate supporters;
   positioning a deposition material source, which is adapted to emanate ions of a deposition material, at a position at which ions emanating from the deposition material source are substantially shielded from impinging on the inner peripheral surfaces of said substrate supporters on which the elongated substrate is supported;
   generating ions of gas of the deposition material from the deposition material source while the substrate supporters are rotating about the second rotational axis;
   applying a bias voltage to the elongated substrate via the inner peripheral surfaces of the substrate supporters to cause the ions generated from the deposition material source to be accelerated toward and to be deposited on the elongated substrate so as to form the film on a longitudinally central portion of the elongated substrate but substantially not on the opposing ends of the elongated substrate by which the elongated substrate is supported on the inner peripheral surfaces of the substrate supporters;
   wherein said step of disposing the opposing ends of the elongated substrate in the recesses of the substrate supporters involves disposing the opposing ends of the elongated substrate in the recesses of the substrate supporters in such a manner than when the elongated substrate is positioned below the second rotational axis, the elongated substrate can remain below the second rotational axis through a full rotation of the substrate supporters about the second rotational axis.

2. A method as recited in claim 1, wherein said step of positioning the deposition material source involves locating the deposition material source away from and not between the substrate supporters.

3. A method as recited in claim 1, wherein said inner peripheral walls of said substrate supporters are respectively cylindrically shaped.

4. A method as recited in claim 1, wherein said step of arranging said substrate supporters involves fixing a connecting shaft to and between said substrate supporters such that opposing ends of said connecting shaft are positioned centrally of said recesses, respectively; and
said steps of providing and arranging said substrate supporters are performed such that the following relation is satisfied:

$$L^2 \neq (m+c)^2 + b^2 - a^2,$$

where L is the length of the elongated substrate, m is a distance between the substrate supporters, c is a depth of each of the recesses, b is a diameter of the inner peripheral surface of each of the substrate supporters, and a is a diameter of the connecting shaft.

5. A method as recited in claim 1, wherein each of said inner peripheral surfaces of said substrate supporters has at least an exposed portion thereof formed of a material which substantially prevents the deposition material from adhering thereto.

6. A method as recited in claim 1, wherein the film formed on the elongated substrate comprises a diamond-like material, and each of the inner peripheral surfaces of said substrate supporters has at least an exposed portion thereof formed of a material including at least one of gold, silver and copper.

7. A method for forming a film on an elongated substrate having opposing ends and a first rotational axis extending therethrough along a length thereof, said method comprising the steps of:
   providing a pair of substrate supporters, each of said substrate supporters having a recess formed therein;
   arranging said substrate supporters such that said recesses formed therein, respectively, confront one another and such that said substrate supporters are rotatable about a second rotational axis extending through both of said recesses;
   disposing the opposing ends of the elongated substrate in the recesses of the substrate supporters, respectively, such that the elongated substrate is loosely supported on inner peripheral surfaces of said substrate supporters and between the substrate supporters;

rotating said substrate supporters simultaneously about said second rotational axis such that the elongated substrate is caused to rotate about said first rotational axis while the opposing ends of the elongated substrate are supported in recesses of said substrate supporters;

positioning a deposition material source, which is adapted to emanate ions of a deposition material, at a position at which ions emanating from the deposition material source are substantially shielded from impinging on the inner peripheral surfaces of said substrate supporters on which the elongated substrate is supported;

generating ions of gas of the deposition material from the deposition material source while the substrate supporters are rotating about the second rotational axis;

applying a bias voltage to the elongated substrate via the inner peripheral surfaces of the substrate supporters to cause the ions generated from the deposition material source to be accelerated toward and to be deposited on the elongated substrate so as to form the film on a longitudinally central portion of the elongated substrate but substantially not on the opposing ends of the elongated substrate by which the elongated substrate is supported on the inner peripheral surfaces of the substrate supporters;

wherein said step of disposing the opposing ends of the elongated substrate in the recesses of the substrate supporters involves disposing opposing ends of a plurality of elongated substrates, respectively, in the recesses of the substrate supporters; and wherein said step of rotating said substrate supporters results in the plurality of elongated substrates rolling over one another.

8. A method for forming films on a plurality of elongated substrates, each having opposing ends and a first rotational axis extending therethrough along a length thereof, said method comprising the steps of:

providing a pair of substrate supporters, each of said substrate supporters having an equal number of recesses formed therein;

arranging said substrate supporters such that said recesses of one of said substrate supporters confront and are aligned with said recesses of the other of said substrate supporters, respectively, and such that said substrate supporters are rotatable about a second rotational axis extending through each of said substrate supporters with said recesses of each of said substrate supporters spaced about the second rotational axis;

disposing the opposing ends of each of the plurality of elongated substrates in an aligned pair of the recesses of the substrate supporters, respectively, to be loosely supported on inner peripheral surfaces of the aligned pair of the recesses, such that each of the elongated substrates is supporters by and between the substrate supporters in such a manner than when the elongated substrates are positioned below the second rotational axis, the elongated substrates can remain below the second rotational axis through a full rotation of the substrate supporters about the second rotational axis;

rotating said substrate supporters simultaneously about said second rotational axis such that the elongated substrates are caused to rotate about their first rotational axes, respectively, while the opposing ends of the elongated substrates are supported in said recesses of said substrate supporters;

positioning a deposition material source, which is adapted to emanate ions of a deposition material, at a position at which ions emanating from the deposition material source are substantially shielded from impinging on the inner peripheral surfaces of the recesses of the substrate supporters on which the elongated substrates are supported, respectively;

generating ions of gas of the deposition material from the deposition material source while the substrate supporters are rotating about the second rotational axis; and applying a bias voltage to the elongated substrates via the inner peripheral surfaces of the recesses of the substrate supporters to cause the ions generated from the deposition material source to be accelerated toward and to be depositioned on the elongated substrates to form the films on longitudinally central portions of the elongated substrates, respectively, but substantially not on the opposing ends of the elongated substrates by which the elongated substrates are respectively supported on the inner peripheral surfaces of the recesses of the substrate supporters.

9. A method as recited in claim 8, wherein
said step of positioning the deposition material source involves locating the deposition material source away from and not between the substrate supporters.

10. A method as recited in claim 8, wherein
said step of disposing the opposing ends of each of the plurality of elongated substrates in an aligned pair of the recesses of the substrate supporters involves disposing opposing ends of more than one of the plurality of substrates in one of the aligned pairs of the recesses of the substrate supporters; and
said step of rotating said substrate supporters results in said more than one of said plurality of elongated substrates rolling over one another.

11. A method as recited in claim 8, wherein
said inner peripheral walls of said recesses of said substrate supporters are respectively cylindrically shaped.

12. A method as recited in claim 8, wherein
said step of arranging said substrate supporters involves fixing a plurality of connecting shafts to and between said substrate supporters such that opposing ends of each of said connecting shafts are positioned centrally of each aligned pair of said recesses, respectively; and
said steps of providing and arranging said substrate supporters are performed such that the following relation is satisfied:

$$L^2 \neq (m+c)^2 + b^2 - a^2,$$

where L is the length of each of the elongated substrates, m is a distance between the substrate supporters, c is a depth of each of the recesses, b is a diameter of the inner peripheral surface of each of the recesses of the substrate supporters, and a is a diameter of each of the connecting shafts.

13. A method as recited in claim 8, wherein
each of said inner peripheral surfaces of said recesses of said substrate supporters has at least an exposed portion thereof formed of a material which substantially prevents the deposition material from adhering thereto.

14. A method as recited in claim 8, wherein the films formed on the elongated substrates comprises a diamond-like material, and each of the inner peripheral surfaces of the recesses of the substrate supporters has at least an exposed portion thereof formed of a material including at least one of gold, silver and copper.

* * * * *

UNITED STATES PATENT AND TRADEMARK OFFICE
CERTIFICATE OF CORRECTION

PATENT NO. : 5,320,877
DATED : June 14, 1994
INVENTOR(S) : Hirokazu NAKAUE et al.

It is certified that error appears in the above-indentified patent and that said Letters Patent is hereby corrected as shown below:

On the cover page, in item [75], the third inventor "Tsutomo MITANI" should read --Tsutomu MITANI--.

Signed and Sealed this

Twenty-second Day of November, 1994

BRUCE LEHMAN

Attest:

Attesting Officer

Commissioner of Patents and Trademarks